United States Patent [19]
Shimada

[11] Patent Number: 5,879,415
[45] Date of Patent: Mar. 9, 1999

[54] SEMICONDUCTOR FABRICATING APPARATUS, METHOD FOR CONTROLLING OXYGEN CONCENTRATION WITHIN LOAD-LOCK CHAMBER AND METHOD FOR GENERATING NATIVE OXIDE

[75] Inventor: Masakazu Shimada, Tokyo, Japan

[73] Assignee: Kokusai Electric Co., Ltd., Tokyo, Japan

[21] Appl. No.: 9,991

[22] Filed: Jan. 21, 1998

Related U.S. Application Data

[62] Division of Ser. No. 648,541, Jun. 15, 1996, Pat. No. 5,735,961.

[30] Foreign Application Priority Data

May 25, 1995 [JP] Japan .................................. 7-150891
Apr. 16, 1996 [JP] Japan .................................. 8-118271

[51] Int. Cl.⁶ .................................................. C23C 16/00
[52] U.S. Cl. ........................... 29/25.01; 427/8; 427/248.1
[58] Field of Search ................... 427/248.1, 8; 29/25.01

[56] References Cited

U.S. PATENT DOCUMENTS

| | | | |
|---|---|---|---|
| 4,369,031 | 1/1983 | Goldman | 432/198 |
| 5,273,423 | 12/1993 | Shiraiwa | 432/241 |
| 5,277,579 | 1/1994 | Takanabe | 432/5 |
| 5,378,283 | 1/1995 | Ushikawa | 118/719 |
| 5,388,944 | 2/1995 | Takanabe | 414/217 |
| 5,407,350 | 4/1995 | Iwabuchi | 432/241 |
| 5,433,785 | 7/1995 | Saito | 118/719 |
| 5,462,397 | 10/1995 | Iwabuchi | 414/222 |
| 5,527,390 | 6/1996 | Ono | 118/719 |
| 5,551,984 | 9/1996 | Tanahashi | 118/724 |
| 5,562,383 | 10/1996 | Iwai | 414/217 |

*Primary Examiner*—Richard Bueker
*Attorney, Agent, or Firm*—Graham & James LLP

[57] ABSTRACT

A semiconductor fabricating apparatus comprises a reaction tube defining a space for heat treating a silicon wafer, heater means disposed to extend around the reaction tube, a load-lock chamber connected to the reaction tube by means of a gate valve, a supply pipe communicating with the load-lock chamber for supplying an inert gas and a gas including oxygen thereto, an oxygen densitometer, an inert gas flow rate adjuster and an oxygen flow rate regulator, and based on the results detected by the oxygen densitometer, controls the flow rate of the inert gas and the gas including oxygen, by means of the flow rate adjuster, the flow rate regulator, to maintain the oxygen concentration within the load-lock chamber at a desire value.

6 Claims, 3 Drawing Sheets

SEMICONDUCTOR FABRICATING APPARATUS, METHOD FOR CONTROLLING OXYGEN CONCENTRATION WITHIN LOAD-LOCK CHAMBER AND METHOD FOR GENERATING NATIVE OXIDE

This is a division of application Ser. No. 08/648,541, now U.S. Pat. No. 5,735,961.

TECHNICAL BACKGROUND

The present invention relates generally to a semiconductor fabricating apparatus having a load-lock chamber and, in particular, to a semiconductor fabricating apparatus which permits control of the oxygen concentration within a load-lock chamber, to a method for controlling the oxygen concentration within a load-lock chamber, and to a native oxide generating method in which the generation of native oxide on a wafer within a load-lock chamber is controlled by controlling the oxygen concentration within the load-lock chamber.

In a process for fabricating a semiconductor device by subjecting a silicon wafer to treatments such as thin film deposition and impurity scattering etching, unnecessary native oxide affects the product quality and yield substantially. Thus, a known semiconductor fabricating apparatus has a load-lock chamber of sealed construction, which is connected to a reaction furnace thereof, for accommodating treated hot substrates to thereby prevent the latter from being native oxidized.

Referring now to FIG. 5, description will be made as to the known apparatus having such a load-lock chamber.

Substrates to be treated are loaded on a cassette and then transported onto a semiconductor fabricating apparatus. The semiconductor fabricating apparatus includes a cassette stocker 2 disposed on a front side thereof, a reaction tube 3 disposed at a rear upper part thereof and a heater 4 disposed to extend around the reaction tube 3. The apparatus also includes a load-lock chamber 5 formed as an airtightly closed container, which is positioned at a lower side of the reaction tube 3 and connected to the reaction tube 3 by means of a gate valve 6. Inside the load-lock chamber 5, a boat elevator (not shown) is provided below the reaction tube 3. The boat elevator is capable of loading into and pulling out from the reaction tube 3 a boat 7 with wafers 10 loaded thereon. A gate valve 8 is provided on a side of the load-lock chamber 5 facing the cassette stocker 2. Between the cassette stocker 2 and load-lock chamber 5, there is provided a wafer transfer unit 9.

A wafer cassette 1 loading wafers 10 thereon is fed into the cassette stocker 2, where the wafers 10 are transferred through the gate valve 8 onto the boat 7 by means of the wafer transfer unit 9. The load-lock chamber 5, after vacuum withdrawing, is filled with an inert gas fed from a gas supply nozzle 11 to turn the inside thereof into an inert gas atmosphere. The gate valve 6 is then opened, and the boat 7 is inserted into the reaction tube 3. Upon completion of the treatment of the wafers 10, the boat 7 is pulled out into the load-lock chamber 5 and cooled down there to a predetermined temperature. Thereafter, the gate valve 8 is opened, and the wafers 10 on the boat 7 are transferred to the wafer cassette 1 of the cassette stocker 2 by means of the wafer transfer unit 9.

If oxygen is present in the atmosphere of the load-lock chamber 5 when the treated, hot wafers 10 are cooled therein, a native oxide layer is formed on the surfaces of the wafers 10 due to the native oxidization occurring on the surfaces, thus adversely affecting the properties of the resulting devices. Also, when the untreated wafers 10 loaded on the boat 7 are loaded into the reaction tube 3 of high-temperature atmosphere (approx. 650°–750° C.), oxygen within the atmosphere of the load-lock chamber 5 reacts with the surfaces of the wafers 10 under high temperature, and a native oxide (n-$SiO_2$) layer forms on the wafer surfaces. The n-$SiO_2$ layer is likely to grow in thickness more than expected, thus imparting adverse effects on the properties of the resulting devices. To suppress the generation of the native oxide layer, the inside of the load-lock chamber 5 is substituted by an inert gas, as described above.

Referring next to FIG. 4, description will be made as to a known apparatus for controlling the gas atmosphere within the load-lock chamber.

The gas supply nozzle 11 extending into the load-lock chamber 5 has a plurality of gas supply apertures (not shown) disposed at predetermined intervals along the length thereof so that the inert gas can be supplied in a diffused fashion. The gas supply nozzle 11 is connected to an inert gas supply source (not shown) and includes an air valve 12 and a flow rate adjuster 13 provided at an intermediate portion of a supply line of the gas supply nozzle 11. For achieving the balanced exhaustion of the atmosphere of the load-lock chamber, the load-lock chamber 5 has an inert gas exhaust pipe 14 communicating therewith at plural portions (only two shown in FIG. 4 for illustration), as well as an exhaust pipe 16 also communicating therewith. The inert gas exhaust pipe 14 has an air valve 15. The exhaust pipe 16 has an air valve 17 and a vacuum pump 18.

For turning the inside of the load-lock chamber 5 into an inert gas atmosphere by the known gas atmosphere control apparatus, the air valves 12 and 15 are opened, and an inert gas is then fed into the load-lock chamber 5 at a predetermined flow rate set by the flow rate adjuster 13 while exhausting the atmosphere of the load-lock chamber 5 through the inert gas exhaust pipe 14, whereby the atmosphere inside the load-lock chamber 5 is substituted by an inert gas atmosphere. In another instance, with the air valves 12 and 15 closed, the air valve 17 is opened and the atmosphere of the load-lock chamber 5 is exhausted once by means of the vacuum pump 18. Thereafter, the valve 17 is closed and the air valve 12 is opened to allow introduction of an inert gas in substitution for the atmosphere of the load-lock chamber 5. This achieves substitution of the atmosphere of the load-lock chamber 5 by the inert gas with oxygen concentration less than 1 ppm under an atmospheric pressure.

In each of the above-described instances, the atmospheric substitution is achieved to such a level that is almost the same as a complete inert gas atmosphere but control of the oxygen concentration is not possible. Depending on devices (e.g., at the time of generation of a gate dioxide ($SiO_2$) layer on the MOS transistor of FIG. 2), it is preferable that a native oxide layer of appropriate level is formed on the surfaces of the untreated wafers 10 as the latter are loaded into the reaction tube 3 of hot atmosphere. This is found to be an n-$SiO_2$ layer of the order of 1–2 atomic layers (less than 2 Å) according to the data obtained through experiments conducted by the inventors hereof. It is not possible for the conventional apparatus to form such appropriate native oxide layer on the wafer surfaces.

In the light of these circumstances, the present invention enables to maintain the oxygen concentration in the internal atmosphere of a container at a desired value and to maintain the gas mixture concentration within a closed container at a desired value so that the generation of an n-$SiO_2$ layer on wafers upon introduction of the wafer into a hot atmosphere can be controlled.

SUMMARY OF THE INVENTION

It is an object of the present invention to maintain the gas mixture concentration within a load-lock chamber at a desired value.

Another object of the present invention is to most appropriately generate a native oxide layer within a load-lock chamber.

According to one aspect of the present invention, there is provided a semiconductor fabricating apparatus comprising a reaction tube defining a space for heat treating a silicon wafer, heatermeans disposed to extend around the reaction tube, a load-lock chamber connected to the reaction tube by means of a gate valve, a supply pipe for supplying to the load-lock chamber an inert gas and a gas including oxygen, and at least one exhaust pipe communicating with the load-lock chamber.

In a specific form, the supply pipe is provided with a flow rate regulator.

Preferably, the exhaust pipe is provided with an oxygen densitometer.

The semiconductor fabricating apparatus may further include an inert gas flow rate adjuster, an oxygen gas flow rate regulator and a controller for controlling the flow rate of the flow rate adjuster and the flow rate regulator, the controller being designed to control the flow rate of the inert gas and the gas including oxygen by means of the flow rate adjuster, the flow rate regulator so as to maintain the inside of the load-lock chamber at a desired oxygen concentration level on the basis of the results detected by the oxygen densitometer.

The gas including oxygen mixes with the inert gas before it flows into the load-lock chamber.

It is preferred that a piping for the oxygen densitometer is disposed independently of the load-lock chamber.

The exhaust pipe is comprised of an exhaust pipe connected to a vacuum pump, an inert gas exhaust pipe and a pipe for the oxygen densitometer.

Preferably, the inert gas is a gas selected from the group consisting of $N_2$, Ar and He.

The gas including oxygen is a gas selected from the group consisting of air, $O_2$, $N_2O$ and NO.

In another aspect of the present invention, there is provided a method for controlling the oxygen concentration within a load-lock chamber in a semiconductor fabricating apparatus comprising a reaction tube defining a space for heat treating a silicon wafer, heater means disposed to extend around the reaction tube, a load-lock chamber connected to the reaction tube by means of a gate valve, a supply pipe communicating with the load-lock chamber for supplying an inert gas and a gas including oxygen thereto, an oxygen densitometer, an inert gas flow rate adjuster and an oxygen gas flow rate regulator, the method comprising the step of controlling the flow rate of the inert gas and the gas including oxygen by means of the flow rate adjuster, the flow rate regulator on the basis of the results detected by the oxygen densitometer in such a manner as to maintain the oxygen concentration within the load-lock chamber at a desire value.

The gas including oxygen is a gas selected from the group consisting of air, $O_2$, $N_2O$ and NO.

The oxygen concentration is controlled to be within the range of 1–100 ppm.

Also, the oxygen concentration is controlled to effect generation of a native oxide layer of less than 2 Å.

The oxygen concentration is controlled to further effect the generation of a native oxide layer of 1–2 atomic layers.

In a still further aspect of the present invention, there is provided a method of generating a native oxide layer on a wafer surface within a load-lock chamber in a semiconductor fabricating apparatus including a reaction tube defining a reaction tube of hot atmosphere and a load-lock chamber connected to the reaction tube via a gate valve, the method comprising the steps of causing a gas including oxygen to flow into the load-lock chamber and loading a wafer into the reaction tube from the load-lock chamber while maintaining the inside of the load-lock chamber at a desired oxygen concentration value to thereby effect the generation of a native oxide layer on a surface of the wafer during loading of the wafer into the reaction tube.

Preferably, the gas including oxygen is selected from the group consisting of air, $O_2$, $N_2O$ and NO.

The oxygen concentration within the load-lock chamber is controlled to be within the range of 1–100 ppm.

A native oxide layer of less than 2 Å is generated on the wafer surface.

A native oxide layer of 1–2 atomic layers is generated on the wafer surface.

BRIEF DESCRIPTION OF THE DRAWINGS

Other objects, features and advantages of the present invention will become apparent from the following detailed description when taken in conjunction with the accompanying drawings, in which.

DETAILED DESCRIPTION OF THE PREFERRED EMBODIMENTS

Figure 1:
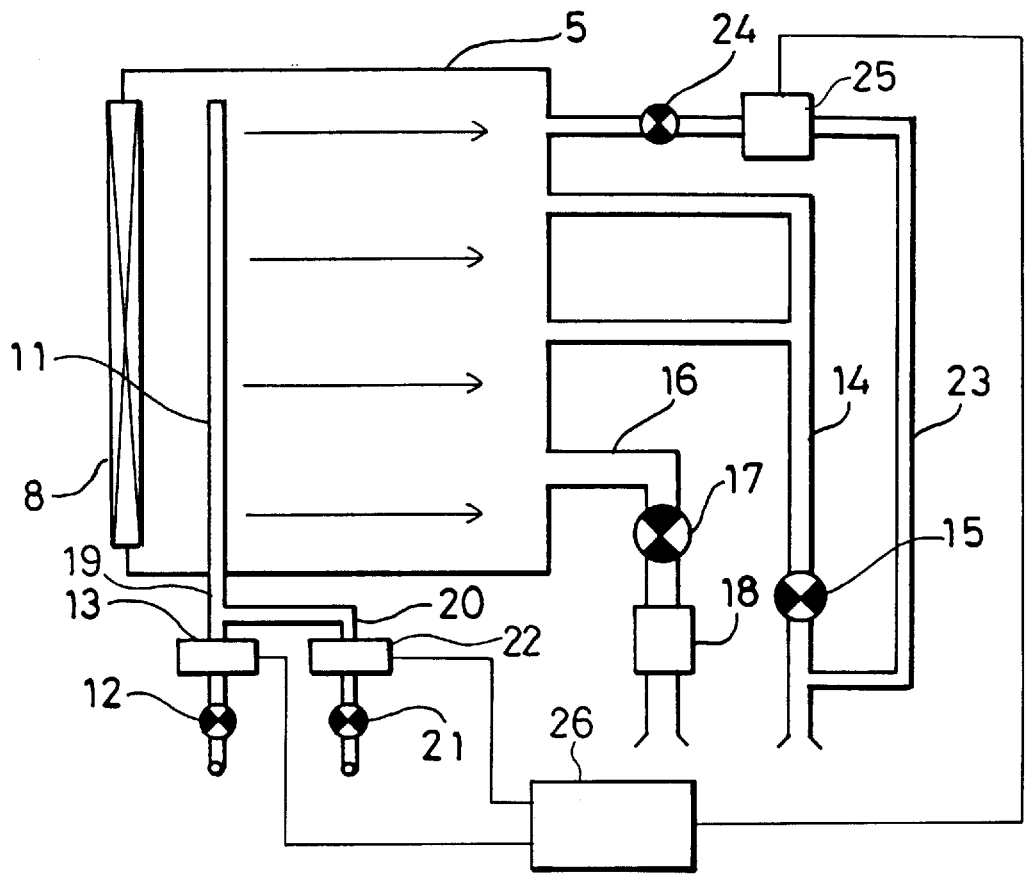
FIG. 1 is a schematic view illustrating an embodiment according to the present invention.
Figure 2:
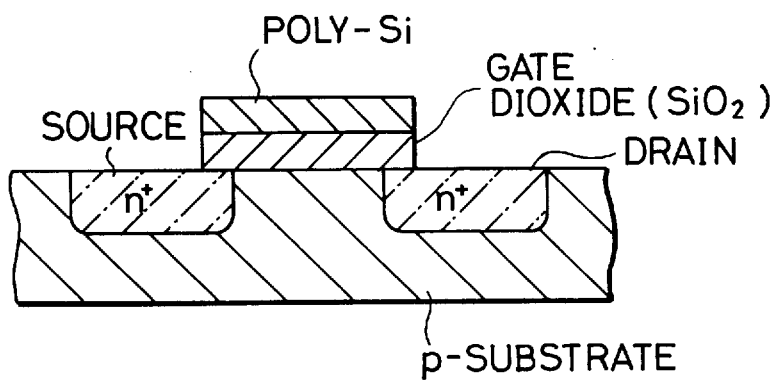
FIG. 2 is a schematic perspective view of an n-channel MOS transistor.
Figure 4:
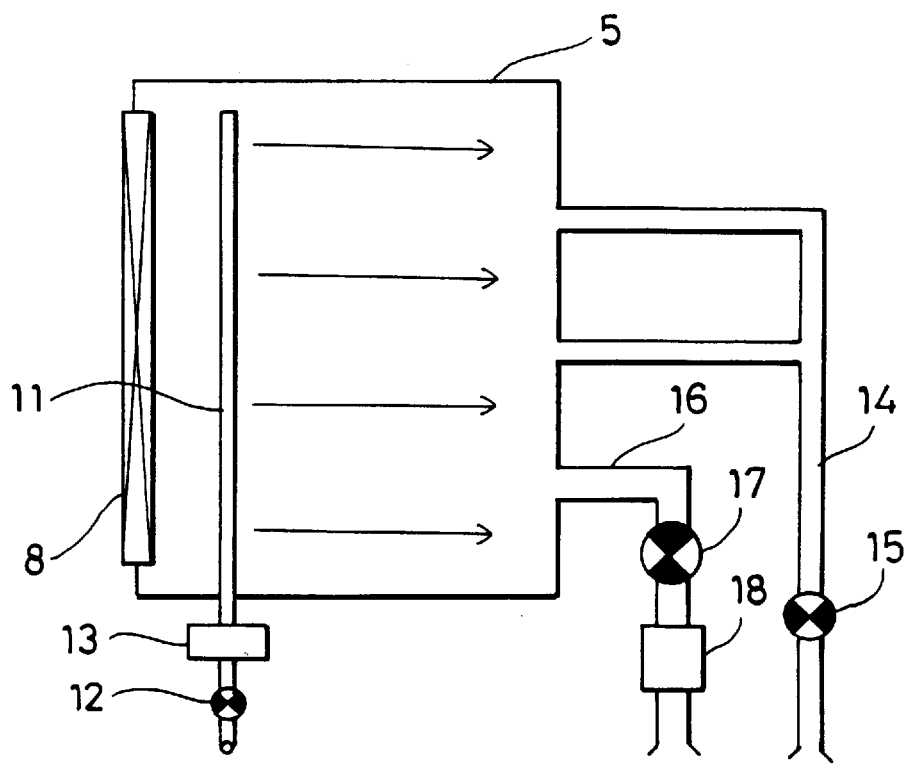
FIG. 4 is a schematic view illustrating a conventional apparatus.
Figure 5:
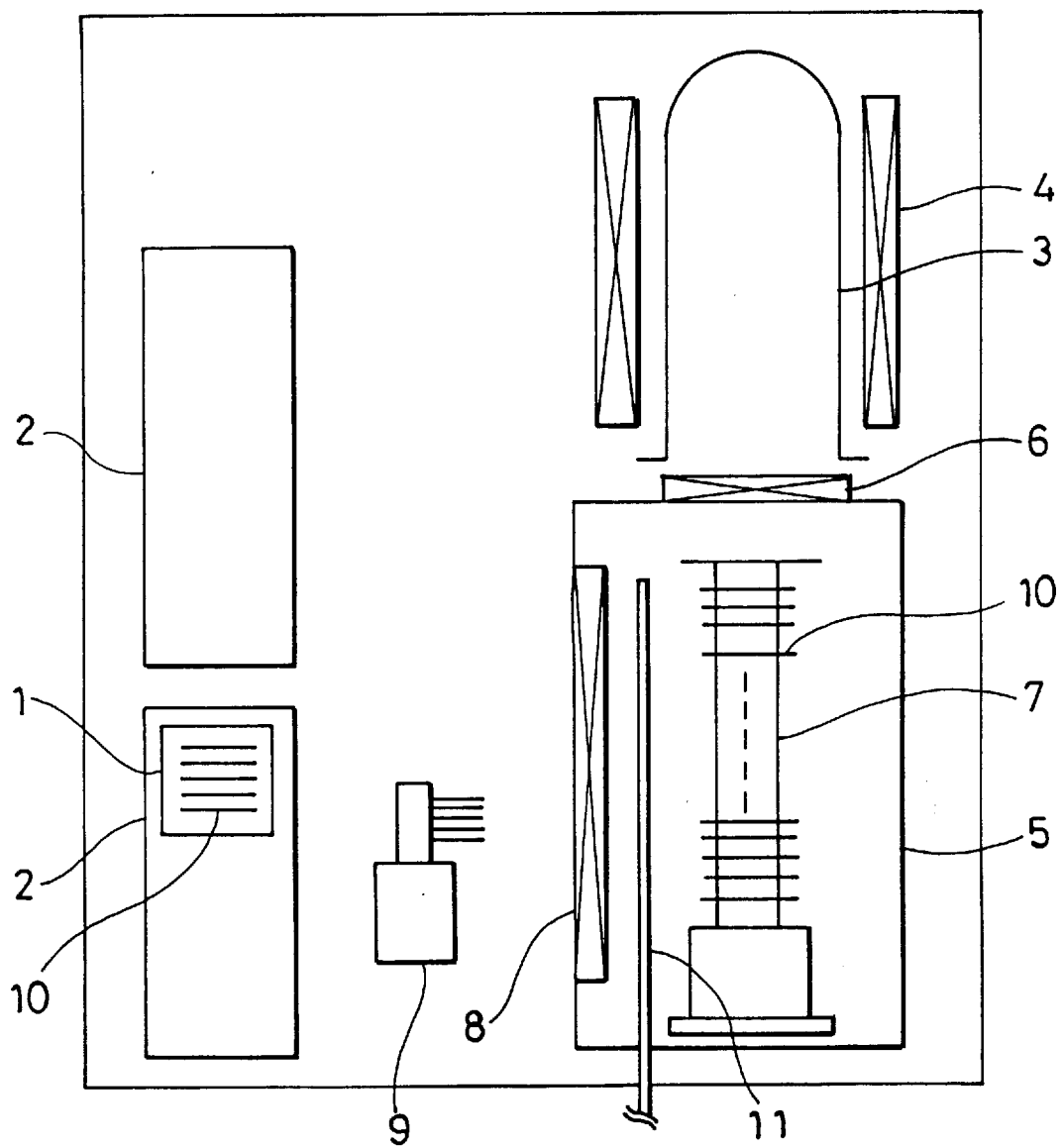
FIG. 5 is a schematic view illustrating a known semiconductor fabricating apparatus.

In FIG. 1, the same reference numerals as used in FIG. 4 will be used for corresponding parts, and their description will be omitted.

An oxygen supply pipe 20 which communicates with the supply pipe 19 at its portion downstream of the flow rate adjuster 13, which in turn communicates with the gas supply pipe 11. On the oxygen supply pipe 20, there are provided an air valve 21 and a flow rate regulator 22 from an upstream side thereof. An auxiliary exhaust pipe 23 has an upstream end communicating with the chamber and a downstream end communicating with the inert gas exhaust pipe 14 at its portion downstream of the air valve 15. On the auxiliary exhaust pipe 23, there are provided an air valve 24 and an oxygen densitometer 25 from an upstream side thereof. A signal from the oxygen densitometer 25 is input into a controller 26, which controls the flow rate adjuster 13 and the flow rate regulator 22 on the basis of the signal output from the oxygen densitometer 25.

Operation of the apparatus is described hereinbelow.

The air valve 12, air valve 15 and air valve 24 are opened to feed an inert gas (e.g., $N_2$, Ar, He, etc.) into the load-lock chamber 5 while maintaining the flow rate at a predetermined value by means of the flow rate adjuster 13. The atmosphere inside the container is exhausted through the inert gas exhaust pipe 14 and auxiliary exhaust pipe 23 to substitute it for an inert gas. The oxygen densitometer 25 measures the oxygen concentration in the exhaustion and feeds a measured value back to the controller 26. If the measured oxygen concentration reaches a predetermined value, the controller 26 opens the air valve 21 and controls the flow rate adjuster 13 and flow rate regulator 22 to regulate the rate of in-flow of the oxygen gas or the mixture ratio of the inert gas and oxygen gas so as to maintain the oxygen gas concentration within the load-lock chamber 5 at a predetermined value.

Operation continues to once exhaust the atmosphere of the load-lock chamber 5 by means of the vacuum pump 18 with the air valve 12, air valve 21, air valve 15 and air valve 24 closed while the air valve 17 is opened. Thereafter, the air valve 17 is closed while the air valve 12, air valve 21, air valve 15 and air valve 24 are opened to introduce an inert gas and oxygen gas through the gas supply pipe 11 and oxygen supply pipe 20 into the chamber at a predetermined mixture ratio, thus effecting the exhaustion through the inert gas exhaust pipe 14 and auxiliary exhaust pipe 23. As a result, the inside of the load-lock chamber 5 is substituted by an inert gas while the oxygen concentration is maintained at a predetermined level. Since the oxygen gas merges with the inert gas before it flows into the load-lock chamber 5, the oxygen gas is diluted by the inert gas and dispersed uniformly as it flows into the load-lock chamber 5. By the oxygen densitometer 25, the oxygen gas concentration within the exhausted gas is detected. Then, the detected oxygen gas concentration is compared with a preset oxygen concentration by the controller to calculate a difference between the detected oxygen gas concentration and the preset oxygen gas concentration, whereafter the flow rate regulator 22 or the flow rate adjuster 13 is adjusted so that the oxygen gas concentration in the exhausted gas is brought to the predetermined value. Further, the oxygen gas flow rate or the inert gas flow rate is adjusted to bring the oxygen gas concentration within the load-lock chamber 5 to the preset value.

After the concentration within the load-lock chamber 5 is brought to the predetermined value, while exhausting a little bit of gas through the auxiliary exhaust pipe 23 and monitoring the oxygen gas concentration within the load-lock chamber 5, the detected results are fed back to the controller 26 to control the flow rate adjuster 13 and the flow rate regulator 22 to thereby maintain the inside of the load-lock chamber 5 at the predetermined oxygen concentration.

The oxygen gas concentration within the load-lock chamber 5 can thus be controlled arbitrarily. As a result, it becomes possible to generate a native oxide layer of most appropriate thickness on the surfaces of the wafers upon loading of the latter into the chamber 5.

Figure 3:
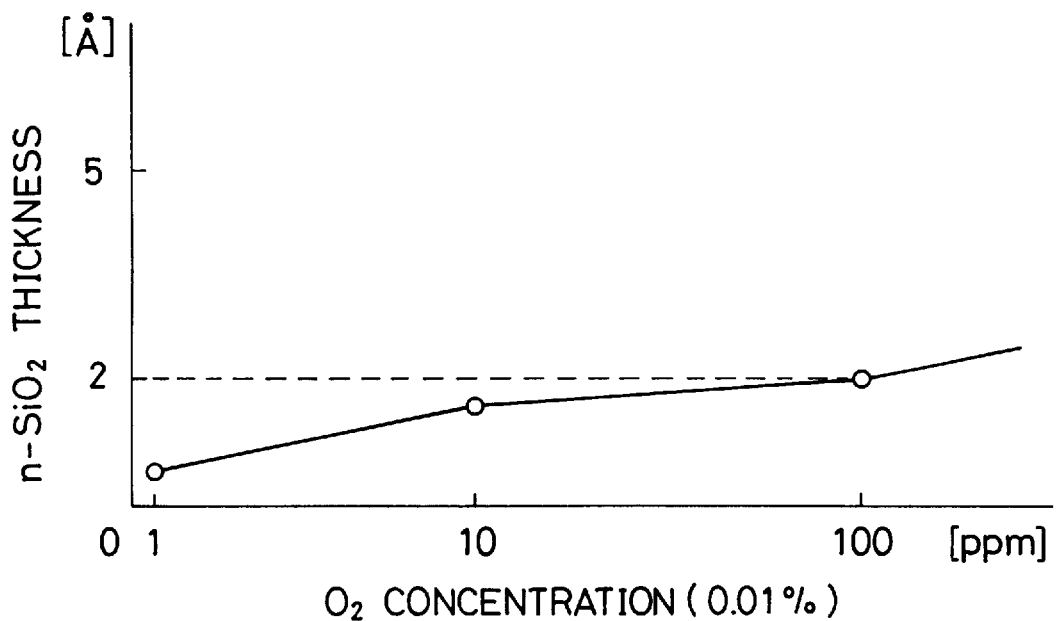
FIG. 3 is a graph showing the relations between an n-$SiO_2$ layer to be generated on the surface of a wafer as the latter is introduced into a 750° C. atmosphere and the oxygen concentration.

Reference is now made to FIG. 3 showing the relations between the oxygen gas concentration within the load-lock chamber 5 as the wafers 10 are loaded into the reaction chamber of hot atmosphere (approx. 750° C.) and n-$SiO_2$ layers to be formed on the wafer surfaces. As seen from FIG. 3, to generate an n-$SiO_2$ layer of 1–2 atomic layers (less than 2 Å) on the wafer surfaces, the oxygen concentration within the load-lock chamber 5 may be controlled within the range of 1–100 ppm. The gas mixture (oxygen gas) to be used in the present invention maybe any gas (e.g., air, $O_2$, $N_2O$, NO, etc.) including oxygen. When $N_2$ is flowed into the load-lock chamber serving as the inert gas, $O_2$, $N_2O$, NO, etc. may be used to generate a good quality n-$SiO_2$ layer.

In the above embodiment, the present invention is described as applied to a semiconductor fabricating apparatus. However, it should be appreciated that the present invention can also be applied to a space for accommodating other precision instruments and devices and to the gas concentration control for turning the inside of a closed container into an atmosphere of predetermined gas components. Further, in an alteration, the apparatus according to the present invention may be provided with gas supply lines for mixing other desired gases and gas concentration detection lines, additionally to the oxygen supply line. Also, other than the exhaust pipe 23, a separate pipe to which a densitometer is mounted may be provided to enable detection of the oxygen concentration within the load-lock chamber. Although the oxygen supply pipe is shown to be connected to an intermediate portion of the inert gas supply line, an oxygen supply nozzle may be separately disposed within the closed chamber. However, the former arrangement, that is, the oxygen supply pipe connected as described above, is preferred, because it causes oxygen to be surely dispersed in and to uniformly flow into the load-lock chamber.

As thus far described, according to the present invention, the atmospheric gas within the load-lock chamber can be composed of desired components. Also, when the present invention is applied to a semiconductor fabricating apparatus and oxygen is selected as the gas mixture, it becomes possible to generate on a wafer surface a native oxide layer having a thickness most suited to the resulting device, thus improving the product quality.

What is claimed are:

1. A method for controlling the oxygen concentration within a load-lock chamber in a semiconductor fabricating apparatus comprising a reaction tube defining a space for heat treating a silicon wafer, heater means disposed to extend around said reaction tube, a load-lock chamber connected to said reaction tube by means of a gate valve, a supply pipe communicating with the load-lock chamber for supplying an inert gas and a gas including oxygen thereto, an oxygen densitometer, an inert gas flow rate adjuster and an oxygen gas flow rate regulator, said method comprising the step of:

controlling the flow rate of said inert gas and said gas including oxygen by means of said flow rate adjuster/ and said flow rate regulator on the basis of the results detected by said oxygen densitometer in such a manner as to maintain the oxygen concentration within said load-lock chamber at a desired value.

2. A method for controlling the oxygen concentration within a load-lock chamber, according to claim 1, wherein said gas including oxygen is a gas selected from the group consisting of air, $O_2$, $N_2O$ and NO.

3. A method for controlling the oxygen concentration within a load-lock chamber, according to claim 2, wherein said oxygen concentration is controlled to be within the range of 1–100 ppm.

4. A method for controlling the oxygen concentration within a load-lock chamber, according to claim 3, wherein said oxygen concentration is controlled to effect generation of a native oxide layer of less than 2 Å.

5. A method for controlling the oxygen concentration within a load-lock chamber, according to claim 3, wherein said oxygen concentration is controlled to effect generation of a native oxide layer of 1–2 atomic layers.

6. A method for controlling the oxygen concentration within a load-lock chamber, according to claim 1, wherein a gas including oxygen is flowed into said load-lock chamber and a wafer is loaded into said reaction tube from said load-lock chamber while maintaining the inside of said load-lock chamber at a desired oxygen concentration value to thereby effect generation of a native oxide layer on a surface of said wafer during loading of said wafer into said reaction tube.

* * * * *